United States Patent
Leibfritz et al.

(10) Patent No.: US 10,768,215 B2
(45) Date of Patent: Sep. 8, 2020

(54) METHOD OF MEASURING THE AM/PM CONVERSION OF A DEVICE UNDER TEST

(71) Applicant: Rohde & Schwarz GmbH & Co. KG, Munich (DE)

(72) Inventors: Martin Leibfritz, Aying (DE); Werner Held, Poecking (DE); Thilo Bednorz, Erding (DE); Walter Weiss, Poing (DE); Jan-Patrick Schultheis, Kirchheim (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 161 days.

(21) Appl. No.: 16/153,550

(22) Filed: Oct. 5, 2018

(65) Prior Publication Data
US 2020/0110118 A1 Apr. 9, 2020

(51) Int. Cl.
*G01R 29/06* (2006.01)

(52) U.S. Cl.
CPC .................... *G01R 29/06* (2013.01)

(58) Field of Classification Search
CPC ...... G01R 23/00; G01R 23/005; G01R 29/06; G01R 13/40; G01R 15/26; G01R 21/127; G01R 33/0041; G01R 1/06788; G01R 11/46; G01R 11/465; G01R 13/38; G01R 31/2603; G01R 19/04
See application file for complete search history.

(56) References Cited

U.S. PATENT DOCUMENTS

| | | | | |
|---|---|---|---|---|
| 4,236,110 A | * | 11/1980 | Shearer | G01R 23/15 324/76.41 |
| 4,361,804 A | * | 11/1982 | Arnold | G01R 29/06 324/76.23 |
| 7,956,615 B1 | * | 6/2011 | Jaoude | G01R 31/389 324/430 |
| 7,977,919 B1 | * | 7/2011 | Jaoude | H04B 1/06 320/129 |
| 8,841,923 B1 | * | 9/2014 | Vanwiggeren | G01R 19/0053 324/606 |
| 2005/0169411 A1 | * | 8/2005 | Kroeger | H04L 27/2624 375/350 |
| 2013/0336422 A1 | * | 12/2013 | Sombrin | H03F 1/3288 375/297 |
| 2014/0133528 A1 | * | 5/2014 | Noest | H03C 5/00 375/219 |

* cited by examiner

*Primary Examiner* — Jermele M Hollington
*Assistant Examiner* — Taqi R Nasir
(74) *Attorney, Agent, or Firm* — Christensen O'Connor Johnson Kindness PLLC

(57) ABSTRACT

A method of measuring the AM/PM conversion of a device under test having a local oscillator is described. A device under test with an embedded local oscillator is provided. A signal source is connected to an input of the device under test. A receiver is connected to an output of the device under test. An input signal is provided by the signal source. The input signal has an initial power level. The input signal is input to the device under test. The power level of the input signal is changed. An output signal of the device under test is measured at different power levels of the input signal.

20 Claims, 3 Drawing Sheets

METHOD OF MEASURING THE AM/PM CONVERSION OF A DEVICE UNDER TEST

FIELD OF THE DISCLOSURE

Embodiments of the present disclosure relate generally to a method of measuring the AM/PM conversion of a device under test having a local oscillator.

BACKGROUND

The AM/PM conversion is a measure of the amount of undesired phase deviation (PM) caused by amplitude variations (AM) inherent in the system such as a device under test with a local oscillator. In fact, the AM/PM conversion corresponds to the amount of undesired phase deviation that is caused by the amplitude variations (AM) at an input of the device under test. For instance, the unwanted phase deviations may be caused by a thermal drift of the device under test, for example the local oscillator.

Under ideal conditions, no interaction between the phase response and the power level of the input signal would occur. However, a certain AM/PM conversion occurs under real conditions. Thus, the AM/PM conversion is a critical parameter since undesired phase deviation causes analog signal degradation or rather increased bit-error rates in digital communication systems. Therefore, it is important to quantity the AM/PM conversion so that the respective interaction can be compensated effectively In the state of the art, the AM/PM conversion is typically measured by using a spectrum analyzer wherein phase results are derived from amplitude measurements performed with the spectrum analyzer. However, this technique has some drawbacks since a multi-carrier group delay approach has to be used in addition for measuring the AM/PM conversion of a device under test having an embedded local oscillator. The multi-carrier group delay approach ensures that a frequency drifting of the local oscillator can be taken into account. However, different techniques are required for measuring the AM/PM conversion of a device under test with an embedded local oscillator.

Accordingly, there is a need for a method of measuring the AM/PM conversion of a device under test in a cost-efficient and simplified manner.

SUMMARY

Embodiments of the Present Disclosure Provide a Method of Measuring the AM/PM Conversion of a Device Under Test Having a Local Oscillator. In Some Embodiments, the Method Comprises the Following Steps:
  providing a device under test with an embedded local oscillator,
  connecting a signal source to an input of the device under test,
  connecting a receiver to an output of the device under test,
  providing an input signal by the signal source, the input signal having an initial power level, the input signal being input to the device under test,
  changing the power level of the input signal, and
  measuring an output signal of the device under test at different power levels of the input signal, wherein the power level of a certain measurement is lower than the power level of a previous measurement and lower than the power level of a subsequent measurement.

According to the present disclosure, the measurement of the device under test for obtaining the AM/PM conversion of the device under test is based on changing the power level significantly while measuring the output signal of the device under test so that hysteresis effects could be taken into account that influence the AM/PM conversion of the device under test. Accordingly, the internal local oscillator influence can be characterized even though no direct access to the local oscillator signal is provided. Therefore, a precise measurement of the AM/PM conversion is possible.

Since the power level of a certain measurement is lower than the power level of a previous measurement and lower than the power level of a subsequent measurement, the power level is not simply increased starting from the initial power level until a maximum power level is reached as it is done in a conventional power sweep. In some embodiments, the power level is increased and lowered afterwards in a continuous manner so that the measurements are done at different power levels. The previous and subsequent measurements may correspond to the immediate previous as well as the immediate subsequent measurements of the certain measurement.

For instance, the signal source may be provided by a vector network analyzer.

The signal source, such as the vector network analyzer, may be connected to the input of the device under test, for instance the intermediate frequency side (IF side) of the device under test. Furthermore, the receiver connected to the output of the device under test may be connected to a radio frequency side (RF side) of the device under test.

Generally, the receiver may be integrated in the vector network analyzer so that a single device under test connection (single DUT connection) is provided by using the vector network analyzer to perform the measurement of the AM/PM conversion of the device under test. Further, in this instance, the device under test has to be connected with the vector network analyzer only once since this single connection is sufficient to obtain all information required for determining the AM/PM conversion of the device under test.

In general, the vector network analyzer used for measuring the output signal can directly measure the phase (information) of the output signal output by the device under test. Thus, it is not necessary to obtain the phase information from measured amplitude values of the output signal as it is done when using a spectrum analyzer for measuring the AM/PM conversion.

Furthermore, the vector network analyzer ensures that a full vector error correction can be applied that effectively eliminates ripples and/or artefacts with respect to the measurement result(s) obtained.

Generally, the power level changes of the input signal may be done by the signal source or rather the vector network analyzer automatically once a respective AM/PM conversion measurement program is activated by a user of the signal source or rather the vector network analyzer.

In addition, the respective power level changes also avoid any significant power stress of the device under test during the measurement(s).

In some embodiments, the device under test with the embedded local oscillator may correspond to a frequency converting device under test.

According to an aspect, the receiver is centered on an anticipated frequency span of the output signal. Thus, the frequency span of the output signal may be estimated or rather predicted initially, for example based upon the power level of the input signal. The estimation or prediction is used to adapt the receiver window in an appropriate manner ensuring that the output signal is received completely, namely over the entire frequency span.

In some embodiments, the receiver is centered on an anticipated frequency span of the output signal for each power level used for a measurement. Since the power levels are changed for the different measurements, the frequency span(s) of the output signal may change during the measurement(s) so that the receiver is centered regularly in an appropriate manner. This ensures that the receiver windows used are quite narrow for each individual measurement so that the required accuracy can be obtained. Thus, the accuracy of the direct phase measurement can be increased by centering the receiver, namely adapting the receiver window, in an appropriate manner. However, the receiver window used is broad enough so as to compensate for potential frequency shifts that might occur during the respective measurements. In addition, deviations of the real frequency span from the estimation or rather prediction are encompassed by the respective receiver window used.

In some embodiments, the receiver window and/or the power level change can be adapted respectively so as to ensure that the output signal is accepted by the receiver. Thus, the respective local oscillator can be captured by the receiver.

For instance, the power level of the previous measurement is different to the power level of the subsequent measurement. Hence, the power levels of the measurements at high power levels, namely prior and after the certain measurement, are different from each other.

Moreover, the power level of the previous measurement is lower than the power level of the subsequent measurement. Thus, the power levels of the measurements increase over time even though the power level is lowered between measurements at high power levels. The respective measurements at the high power levels may relate to a power sweep wherein the power level of the input signal is always returned to a reference power level, namely the initial power level, after each measurement at a high power level.

The power level of the input signal may be changed between the initial power level and a maximum power level. Thus, the power levels used for the different measurements are limited by a range of power which boundaries are defined by the initial power level and the maximum power level.

A power sweep may be used for changing the power level. During this power sweep, different power levels are used for the measurements. The power sweep may be assigned to a minimum power level as a starting power level of the power sweep and the maximum power level corresponding to an absolute upper limit. In some embodiments, the minimum power level of the power sweep may be higher than the initial power level since the minimum power level is assigned to the measurement(s) at high power levels. Accordingly, the power sweep may be assigned to the measurement(s) at the high power levels.

Generally, a local oscillator signal may be constant while the power level is changed. Thus, the local oscillator signal forwarded to the embedded local oscillator of the device under test is maintained constant during the different measurement(s).

For the measurement purposes, it is at least assumed that the local oscillator signal is maintained constant while the power levels are changed.

In some embodiments, the input signal with the initial power level may correspond to a reference signal. The reference signal may relate to a power level that is safe in terms of showing significant conversion/compression effects. This reference signal or the corresponding power level can be used for the phase measurement(s) as a reference. Thus, the reference signal can be used for comparing with a measurement done at a higher power level.

For instance, the power level of the input signal is varied so as to provide at least one signal pulse. The signal pulse(s) has/have a higher power level with regard to the power level of the reference signal that may relate to the initial power level. After the at least one signal pulse, the power level of the input signal is returned back to the power level of the reference signal, namely the initial power level.

Furthermore, the power level of the input signal may be varied so as to provide several signal pulses. The power level of the input signal is returned back to the power level of the reference signal after each signal pulse. Thus, the phase measurement of the output signal, when the reference signal is input, corresponds to the certain measurement since its power level is lower than the power level of the previous measurement, namely the previous signal pulse, as well as lower than the power level of a subsequent measurement, namely the subsequent signal pulse.

Further, a signal pulse has a power level being higher than the power level of a previous signal pulse. The power levels of subsequent signal pulses may increase over time so that the power level of the previous measurement, namely the previous signal pulse, is lower than the power level of the subsequent measurement, namely the subsequent signal pulse.

According to another aspect, the power level of the input signal may be lowered to the initial power level after the at least one signal pulse. The power level is always returned back to the initial power level corresponding to the reference signal after each signal pulse so as to provide a reference signal, for example with regard to the power level.

Furthermore, phase values measured prior and after the at least one signal pulse are averaged to obtain an average phase value at the initial power level. As discussed above, the power level is always returned back to the initial power level after each signal pulse so that two phase measurement at the initial power level can be done which are averaged so as to obtain a reference phase value. In other words, the average of the phase values obtained prior and after each signal pulse may be processed to obtain a reference phase value for further processing. Therefore, a reference phase value is obtained regularly since a reference signal having a reference phase value is defined for each signal pulse wherein this reference phase is updated multiple times during the power sweep. This allows to compensate for a drifting local oscillator during the measurements.

Further, a phase value is measured at the at least one signal pulse. Thus, phase information is also obtained during a respective signal pulse, for example for each signal pulse. In some embodiments, the phase information or rather the phase value is measured for each signal pulse of the several signal pulses.

Another aspect provides that the average phase value is compared with the phase value measured at the at least one signal pulse. In some embodiments, the average phase value obtained is compared with the corresponding phase value measured at the dedicated signal pulse for each of the several signal pulses. Thus, the signal phase can be obtained in a most accurate manner since a frequency shift or rather drifting of the local oscillator is taken into account in an appropriate manner. In some embodiments, the reference phase is updated regularly, namely for each phase measurement at a signal pulse corresponding to a measurement at a high power level.

In other words, the average phase value at the initial power level may correspond to a reference phase that is updated regularly. Since the phase value is measured prior and after a corresponding signal pulse, the reference phase is updated several times, namely for each signal pulse.

According to another aspect, a ramp for the power level of the input signal is started, the power level being increased by a small increment of the total ramp and a measurement being conducted, the power level being reduced by a portion of the small increment to adapt the power level and a measurement being conducted. This relates to an increasing flank of a triangular shaped ramp for the power level. In some embodiments, the significantly changing power level may correspond to a ramp having a certain shape. Since the power level is increased by a small increment and directly afterwards reduced by a portion of the small increment, the ramp, for example an increasing flank, is split into several portions that are tooth-shaped. The increasing and lowering of the power level by respective portions ensure that hysteresis effects can be taken into account in an appropriate manner.

This change of the power level may relate to a triangular approach since the power level can be ramped from the initial power level to a maximum power level (increasing flank) as discussed above. Afterwards, the power level is ramped back to the initial power level (decreasing flank) in a mirrored manner. This means that the power level is decreased by a small increment and directly afterwards increased by a portion of the small increment so that the ramp, for example a decreasing flank, is split into several portions that are also tooth-shaped.

In some embodiments, this triangular approach can be applied for devices under test having small frequency drift of the local oscillator.

For instance, the small increment is a tenth of the total ramp or less. Thus, the ramp for the power level may be split into at least ten portions so as to ensure that sufficient measurement points can be obtained for measuring the AM/PM conversion at different power levels.

According to another aspect, a ramp for the power level of the input signal is started that has a substantially triangular shape. The ramp may correspond to the ramp mentioned above wherein the power level is increased by a small increment of the total ramp and a measurement being conducted, the power level being reduced by a portion of the small increment to adapt the power level and a measurement being conducted. These steps are repeated several times so as to establish the increasing flank of the substantially triangular shape of the ramp for the power level. Once the maximum power level is reached, the decreasing flank of the substantially triangular shaped ramp for the power level takes place. For doing so, the power level is decreased by a small increment of the total ramp and a measurement is conducted. Then, the power level is increased by a portion of the small increment to adapt the power level and a measurement being conducted. These steps are repeated several times so as to establish the decreasing flank of the substantially triangular shape of the ramp for the power level. In total, the ramp for the power level of the input signal has a substantially triangular shape which is also called triangular approach.

Despite of the triangular approach, other significant changes of the power level may be used, for instance a rectangular, a saw-tooth or any other significant change in the power level wherein the same concept as mentioned above is applied. This means that an output signal of the device under test is measured at different power levels of the input signal following the respective shape resulting in significant changes of the power level, wherein the power level of a certain measurement is lower than the power level of a previous measurement and lower than the power level of a subsequent measurement.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
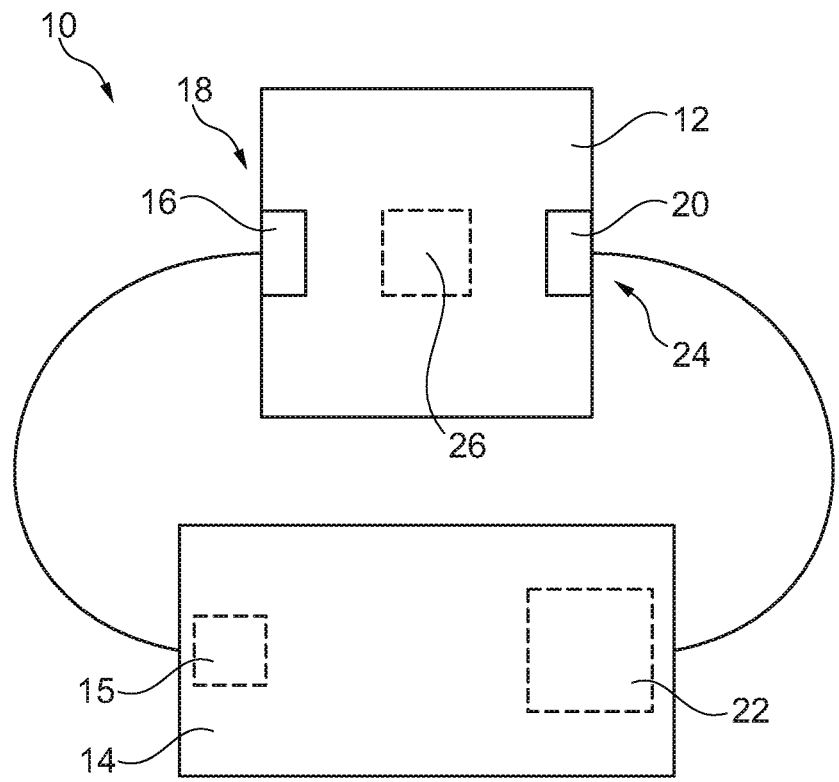
FIG. 1 schematically shows a system that is used for performing a representative embodiment of a method of measuring the AM/PM conversion according to the present disclosure.

In FIG. 1, a system 10 is shown that comprises a device under test 12 as well as a vector network analyzer 14 having a signal source 15. Therefore, the vector network analyzer 14 corresponds to the signal source 15. As shown in FIG. 1, the device under test 12 comprises an input 16 to which the vector network analyzer 14 is connected. The input 16 is established at an intermediate frequency (IF) side 18 of the device under test 12.

The device under test 12 also has an output 20 to which a receiver 22 is connected that is integrated in the vector network analyzer 14. The output 20 is established at a radio frequency (RF) side 24 of the device under test 12. Accordingly, the vector network analyzer 14 comprises the signal source 15 as well as the receiver 22.

Thus, the vector network analyzer 14, for example the signal source 15, generates an input signal that is input to the intermediate frequency side 18 of the device under test 12. The device under test 12 processes the input signal internally wherein an output signal is provided at the radio frequency side 24 that is forwarded to the receiver 22, namely the vector network analyzer 14. Thus, the vector network analyzer 14 is configured to analyze the output signal of the device under test 12 appropriately. The internal processing of the input signal is done by an embedded local oscillator 26 that uses a local oscillator signal.

Figure 2:
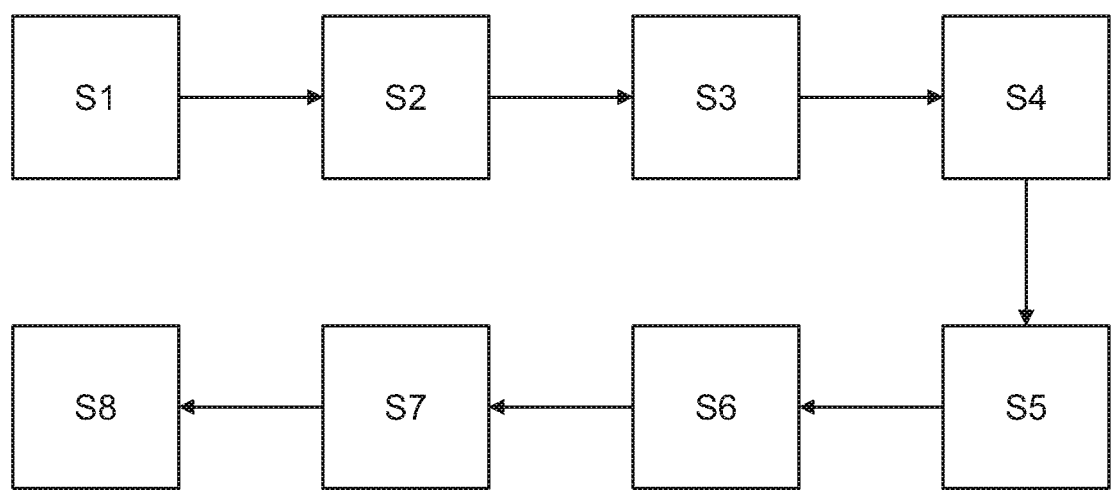
FIG. 2 schematically shows a flow-chart illustrating an example of a method of measuring the AM/PM conversion according to the present disclosure.

With reference to FIG. 2, a representative embodiment of a method of measuring the AM/PM conversion of the device under test 12 will be described hereinafter.

In a first step S1, the device under test 12 with the embedded local oscillator 26 is provided. In a second step S2, the vector network analyzer 14, for example the signal source 15, is connected to the input 16 of the device under test 12. In a third step S3, the receiver 22, namely the vector network analyzer 14 itself, is connected to the output 20 of the device under test 12.

In a fourth step S4, an input signal is provided by the vector network analyzer 14, for example the signal source 15, wherein the input signal has an initial power level at least at the beginning. The input signal provided by the vector network analyzer 14 or the signal source 15 is input to the device under test 12 via its input 16 so that the input signal is internally forwarded to the local oscillator 26 of the device under test 12 for internal processing. The device under test 12 then generates an output signal based on the input signal which is forwarded to the receiver 22, namely the vector network analyzer 14, via the output 20 of the device under test 12.

In a fifth step S5, the receiver 22 or the vector network analyzer 14 measures, analyzes, etc., the output signal provided by the device under test 12 so as to measure the phase.

In a sixth step S6, the power level of the input signal is changed significantly so that the output signal of the device under test 12 is also changed. In a seventh step S7, the receiver 22 or the vector network analyzer 14 is centered on an anticipated frequency span of the output signal of the device under test 12.

In an eighth step S8, the output signal of the device under test 12 is measured at a different power level of the input signal with regard to the power level of the input signal provided at the fifth step S5.

In some embodiments, the above mentioned steps, namely steps S5 to S8, are repeated iteratively so that the input signal is changed with regard to its power level several times wherein the output signal of the device under test 12 is measured for the different power levels of the input signal. Further, the receiver 22 or the vector network analyzer 14, is centered regularly. Thus, the receiver 22 or the network analyzer 14 is centered for each power level used for a measurement. This ensures that the receiver window is quite small so as to ensure a high accuracy for the respective measurement.

It is further at least assumed that the local oscillator signal forwarded to the local oscillator 26 is constant while the power level is changed.

In some embodiments, the power levels are changed such that the power level of a certain measurement is lower than the power level of a previous measurement and lower than the power level of a subsequent measurement. This becomes obvious in FIGS. 3 and 4 showing exemplary power level changes during the respective AM/PM conversion measurements.

Figure 3:
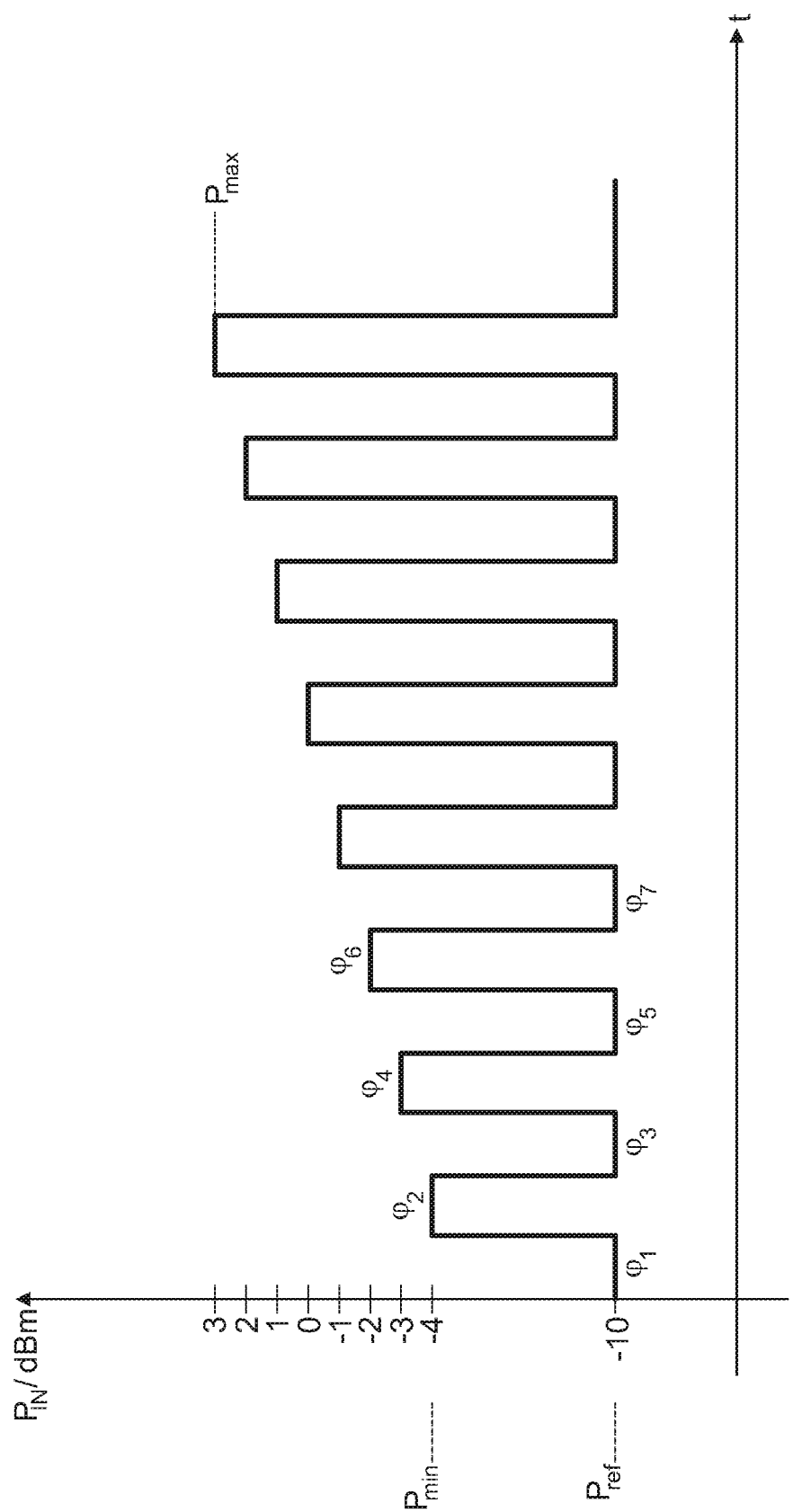
FIG. 3 shows a diagram illustrating the changing power level according to an aspect of the present disclosure.
Figure 4:
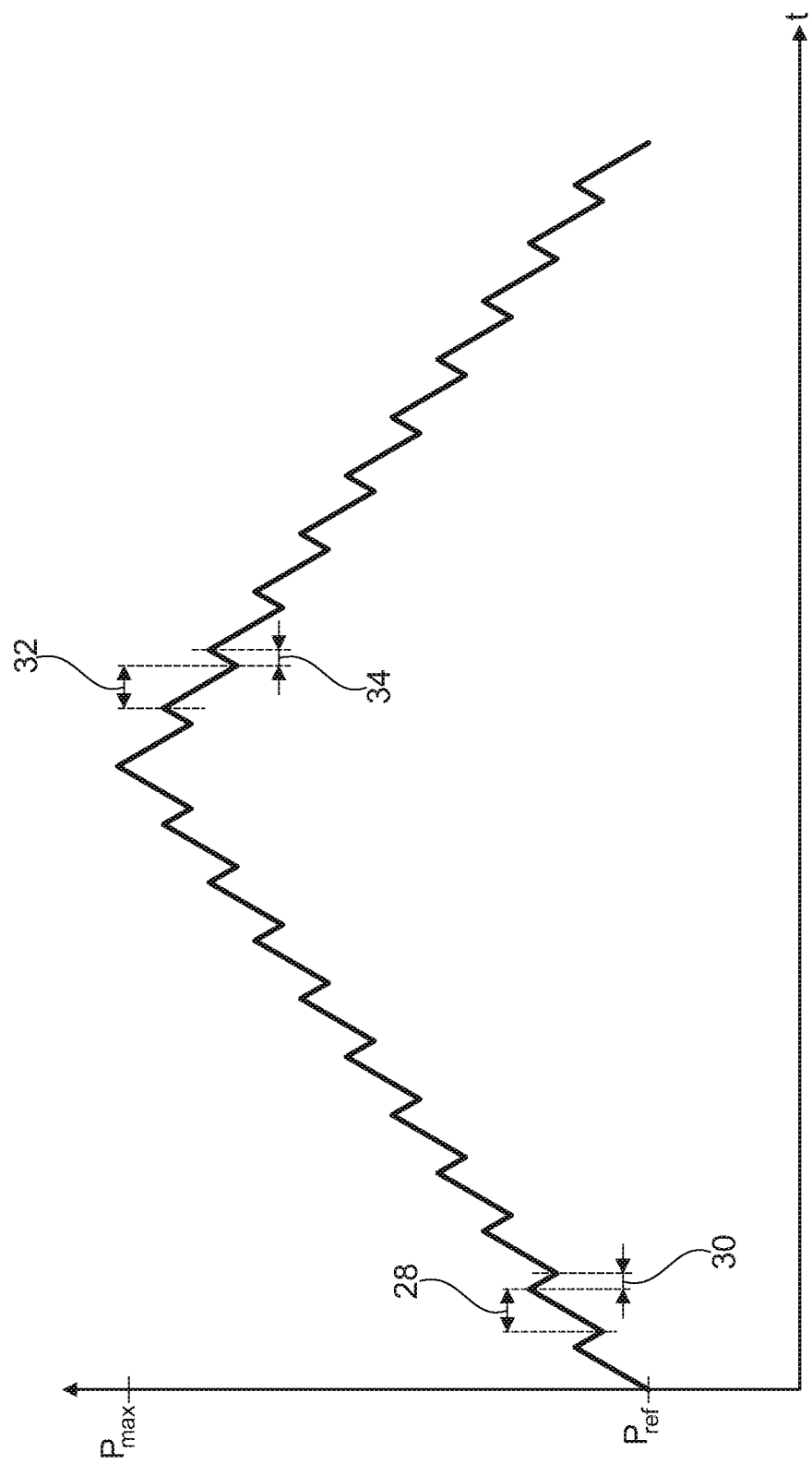
FIG. 4 shows another diagram illustrating the changing power level according to another aspect of the present disclosure.

In FIG. 3, a representative power level change is shown that can be used during the measurement of the AM/PM conversion of the device under test 12. As shown in FIG. 3, the input signal starts at an initial power level that is indicated as reference power $P_{ref}$. In some embodiments, the input signal with the reference power $P_{ref}$ corresponds to a reference signal.

Then, the power level of the input signal is increased to a first power level indicated as minimum power level $P_{min}$, wherein the power level is decreased afterwards to the initial power level again, namely the reference power $P_{ref}$. Next, the power level of the input signal is increased again to a second power level that is higher than the first power level, namely the minimum power level $P_{min}$, wherein the power level is decreased back to the initial power level or rather the reference power level $P_{ref}$.

The signals with the first power level as well as the second power level correspond to signal pulses which becomes obvious from FIG. 3. The signal pulses have different power levels.

In some embodiments, several signal pulses are provided each having power levels higher than the initial power level or rather the reference power level $P_{ref}$. As shown in FIG. 3, the power level of each signal pulse is higher than the power level of the previous signal pulse so that a power sweep, for example an increasing power sweep, for the signal pulses is provided. The power sweep starts at the minimum power level $P^{min}$, wherein the power level is increases for each signal pulse until a maximum power level $P^{max}$, is reached. Thus, a power sweep or rather a ramp is used for the signal pulses since the respective power levels of the signal pulses increase continuously.

As indicated in FIG. 3, the power level is returned back to the initial power level or rather the reference power level $P_{ref}$ after each signal pulse.

Moreover, the phase φ of the output signal is measured by the receiver 20 or the vector network analyzer 14 for each different power level, namely every time the power level is decreased to the initial power level or rather the reference power level $P_{ref}$ as well as the different high power levels at the respective signal pulses. This is indicated by the respective phase values $\varphi_x$ shown in FIG. 3.

Further, an average phase value is determined by averaging the phase values measured prior and after each signal pulse so as to obtain a reference phase used for comparison with the phase value measured at the assigned signal pulse.

In general, the average phase value can be indicated as follows:

$$\overline{\varphi}_{x,x+2} = \frac{\varphi_x + \varphi_{x+2}}{2},$$

wherein x is odd-numbered, namely 1, 3, 5, 7 and so on. For instance, the first average phase value can be determined by:

$$\overline{\varphi}_{1,3} = \frac{\varphi_1 + \varphi_3}{2}$$

As mentioned above, the average phase value determined is compared with the signal pulse assigned thereto, namely the signal pulse that is located between the phase values measured prior and after the respective signal pulse at the initial power level or the reference power level $P_{ref}$. Thus, the phase value of the signal pulse can be indicated generally as $\varphi_y$, wherein y is even-numbered, namely 2, 4, 6, 8 and so on.

In some embodiments, the phase of the output signal is measured at the beginning, namely at the initial power level or the reference power level $P_{ref}$ so that the phase value $\varphi_1$ is obtained. Then, the phase of the output signal is measured at the first signal pulse, so that the phase value $\varphi_2$ is obtained.

Moreover, the phase of the output signal is measured when the power level is decreased to the initial power level or rather the reference power level $P_{ref}$ so that the phase value $\varphi_3$ is obtained.

The phases or rather phase values measured prior and after the respective signal pulses having the first power level are averaged so that a reference phase is obtained for the first signal pulse having the first power level. This reference phase obtained is compared with the phase measured at the first signal pulse.

The reference phase is updated regularly for each signal pulse by averaging the phase values measured prior and after the respective signal pulse. The advantage of this approach is that a reference phase is determined for each signal pulse so that frequency drifts of the local oscillator 26 can be taken into account since the reference phase is updated several times during the measurements, namely for each signal pulse.

In general, the measurement of the phase that takes place after the first signal pulse may relate to a certain measurement which power level is lower than the power level of the previous measurement, namely the previous signal pulse, and lower than the power level of the subsequent measurement, namely the subsequent signal pulse. In some embodiments, the power levels of the previous signal pulse as well as the subsequent signal pulse are higher than the power level of the certain measurement.

In FIG. 4, another approach for changing the power level of the input signal significantly over time is shown. In this approach, the power level of the input signal is ramped wherein the power level starts at the initial power level or rather the reference power level $P_{ref}$. The power level is increased to a maximum power level $P_{max}$. Then, the power level is reduced or rather decreased from the maximum power level $P_{max}$ back to the initial power level or rather the reference power level $P_{ref}$ as shown in FIG. 4.

Accordingly, this approach corresponds to a triangular approach since the ramping of the power level corresponds to a triangular ramp.

However, the ramping of the power level is split since the power level is increased by a small increment 28 of the total ramp to provide a power level at which a measurement is done. Then, the power level is decreased by a portion 30 of the small increment 28 so that another power level is provided at which a measurement is done.

The increasing and decreasing take place several times or iteratively until the maximum power level $P_{max}$ is reached. From the maximum power level $P_{max}$, the power level for the different measurements is decreased in a mirrored manner since the power level is decreased by a small increment 32 of the total ramp to provide a power level at which a measurement is done wherein the power level is increased by a portion 34 of the small increment 32 so that another power level is provided at which a measurement is done.

The decreasing and increasing take place several times or iteratively until the initial power level or rather the reference power level $P_{ref}$ is reached.

The small increments 28, 32 may have the same amount. In addition, the portions 30, 34 may have the same amount.

Therefore, hysteresis effects that may occur in the device under test can be monitored appropriately.

In some embodiments, the small increment 28, 32 used for increasing or decreasing the power level may correspond to a tenth of the total ramp or less that is used for changing the power level.

In general, the AM/PM conversion of the device under test 12 having the embedded local oscillator 26 can be measured directly and effectively wherein the accuracy desired is obtained.

In addition, hysteresis effects as well as local oscillator drifts, namely frequency drifts of the local oscillator 26, can be taken into account in an appropriate manner so that an improved measurement of the AM/PM conversion of the device under test 12 is done.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A method of measuring the AM/PM conversion of a device under test having a local oscillator, with the following steps:
   providing a device under test with an embedded local oscillator,
   connecting a signal source to an input of said device under test,
   connecting a receiver to an output of said device under test,
   providing an input signal by said signal source, said input signal having an initial power level, said input signal being input to said device under test,
   changing the power level of said input signal, and
   measuring an output signal of said device under test at different power levels of said input signal, wherein the power level of a certain measurement is lower than the power level of a previous measurement and lower than the power level of a subsequent measurement.

2. The method according to claim 1, wherein said receiver is centered on an anticipated frequency span of the output signal.

3. The method according to claim 1, wherein said receiver is centered on an anticipated frequency span of the output signal for each power level used for a measurement.

4. The method according to claim 1, wherein the power level of said previous measurement is different to the power level of said subsequent measurement.

5. The method according to claim 1, wherein the power level of said previous measurement is lower than the power level of said subsequent measurement.

6. The method according to claim 1, wherein the power level is changed between said initial power level and a maximum power level.

7. The method according to claim 1, wherein a power sweep is used for changing the power level.

8. The method according to claim 1, wherein a local oscillator signal is constant while the power level is changed.

9. The method according to claim 1, wherein said input signal with the initial power level corresponds to a reference signal.

10. The method according to claim 1, wherein the power level of said input signal is varied so as to provide at least one signal pulse.

11. The method according to claim 1, wherein the power level of said input signal is varied so as to provide several signal pulses.

12. The method according to claim 11, wherein a signal pulse has a power level being higher than the power level of a previous signal pulse.

13. The method according to claim 10, wherein the power level of said input signal is lowered to the initial power level after the at least one signal pulse.

14. The method according to claim 10, wherein phase values measured prior and after the at least one signal pulse are averaged to obtain an average phase value at the initial power level.

15. The method according to claim 10, wherein a phase value is measured at the at least one signal pulse.

16. The method according to claim 14, wherein the average phase value is compared with the phase value measured at the at least one signal pulse.

17. The method according to claim 14, wherein the average phase value at the initial power level corresponds to a reference phase that is updated regularly.

18. The method according to claim 1, wherein a ramp for the power level of said input signal is started, the power level being increased by a small increment of the total ramp and a measurement being conducted, the power level being reduced by a portion of said small increment to adapt the power level and a measurement being conducted.

19. The method according to claim 18, wherein the small increment is a tenth of the total ramp or less.

20. The method according to claim 1, wherein a ramp for the power level of said input signal is started that has a substantially triangular shape.

* * * * *